United States Patent
Guillorn et al.

(10) Patent No.: US 8,440,523 B1
(45) Date of Patent: May 14, 2013

(54) MICROMECHANICAL DEVICE AND METHODS TO FABRICATE SAME USING HARD MASK RESISTANT TO STRUCTURE RELEASE ETCH

(75) Inventors: Michael A Guillorn, Yorktown Heights, NY (US); Fei Liu, Yorktown Heights, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/313,163

(22) Filed: Dec. 7, 2011

(51) Int. Cl.
*H01L 21/8242* (2006.01)

(52) U.S. Cl.
USPC .......... 438/243; 257/E21.165; 257/E21.002; 257/E21.704; 438/664; 438/682; 438/723; 438/706

(58) Field of Classification Search .......... 257/E21.165, 257/E21.002, E21.704; 438/664, 682, 706, 438/710–712, 723–743, 50–52, 243–250
See application file for complete search history.

(56) References Cited

U.S. PATENT DOCUMENTS

| | | | | |
|---|---|---|---|---|
| 5,629,918 | A * | 5/1997 | Ho et al. | 310/40 MM |
| 6,399,516 | B1 * | 6/2002 | Ayon | 438/739 |
| 6,900,134 | B1 * | 5/2005 | Shih et al. | 438/702 |
| 7,138,694 | B2 * | 11/2006 | Nunan et al. | 257/419 |
| 7,825,484 | B2 * | 11/2010 | Martin et al. | 257/415 |
| 8,143,971 | B2 * | 3/2012 | Beek et al. | 333/186 |
| 8,309,386 | B2 * | 11/2012 | Weigold | 438/53 |
| 2004/0129958 | A1 * | 7/2004 | Koh et al. | 257/275 |
| 2004/0157395 | A1 * | 8/2004 | Yoo | 438/257 |
| 2005/0036196 | A1 * | 2/2005 | Barnea et al. | 359/291 |
| 2005/0036269 | A1 * | 2/2005 | Ma et al. | 361/301.1 |
| 2006/0205106 | A1 * | 9/2006 | Fukuda et al. | 438/52 |
| 2008/0044772 | A1 * | 2/2008 | Guerrero et al. | 430/312 |
| 2008/0174010 | A1 | 7/2008 | Suzuki et al. | |
| 2008/0248604 | A1 * | 10/2008 | Christenson et al. | 438/52 |
| 2008/0261372 | A1 * | 10/2008 | Jafri et al. | 438/393 |
| 2009/0108381 | A1 * | 4/2009 | Buchwalter et al. | 257/415 |
| 2009/0179286 | A1 * | 7/2009 | Schoen et al. | 257/415 |
| 2010/0181173 | A1 * | 7/2010 | Rodriguez et al. | 200/181 |
| 2010/0243414 | A1 * | 9/2010 | Luce et al. | 200/181 |

(Continued)

OTHER PUBLICATIONS

MEMS-Exchange Org., "Fabricating MEMS and Nanotechnology", downloaded on Mar. 28, 2011 and available at http://www.mems-exchange.org/MEMS/fabrication.html.

(Continued)

*Primary Examiner* — N Drew Richards
*Assistant Examiner* — Ankush Singal
(74) *Attorney, Agent, or Firm* — Harrington & Smith

(57) ABSTRACT

A method is disclosed to fabricate an electro-mechanical device such as a MEMS or NEMS switch. The method includes providing a structure composed of a silicon layer disposed over an insulating layer that is disposed on a silicon substrate. The silicon layer is differentiated into a partially released region that will function as a portion of the electro-mechanical device. The method further includes forming a dielectric layer over the silicon layer; forming a hardmask over the dielectric layer, the hardmask being composed of hafnium oxide; opening a window to expose the partially released region; and fully releasing the partially released region using a dry etching process to remove the insulating layer disposed beneath the partially released region while using the hardmask to protect material covered by the hardmask. The step of fully releasing can be performed using a HF vapor.

16 Claims, 7 Drawing Sheets

U.S. PATENT DOCUMENTS

| | | | |
|---|---|---|---|
| 2010/0279234 | A1 | 11/2010 | Yu et al. |
| 2010/0314258 | A1* | 12/2010 | Cohen et al. .................. 205/188 |
| 2010/0314668 | A1* | 12/2010 | Ollier et al. ................... 257/252 |
| 2011/0279201 | A1* | 11/2011 | Pensala et al. ............. 333/219.1 |
| 2012/0092082 | A1* | 4/2012 | Hentz et al. .................. 331/154 |
| 2012/0273966 | A1* | 11/2012 | Ding et al. .................... 257/774 |
| 2012/0318649 | A1* | 12/2012 | Guillorn et al. ............... 200/181 |

OTHER PUBLICATIONS

Ramstad et al., "CMOS-MEMS Integration", Mar. 27, 2006, downloaded on Mar. 30, 2011 and available at http://folk.uio.no/janera/master_filer/Essay_27_03_2006.pdf.

Mouaziz et al., "Combined Al-Protection and HF-Vapor Release Process for Ultrathin Single Crystal Silicon Cantilevers", Microelectronic Engineering 83 (2006), pp. 1306-1308, also available on line Feb. 28, 2006 at www.sciencedirect.com and www.elsevier.com/locate/mee.

Bakke et al., "Etch Stop Materials for Release by Vapor HF Etching", downloaded on Mar. 30, 2011 and available at http://www.idonus.com/txt/products/vpe/publications/Bakke_MME05%20etch%20stop%20materials%20for%/20release%20by%20vapor%20hf%20etching.pdf.

Williams et al., "Etch Rates for Micromaching Processing—Part II", downloaded on Mar. 30, 2011 and available at http://microlab.berkeley.edu/labmanual/chap1/JMEMSEtchRates2%282003%29.pdf.

Gilgunn et al., "Flip-Chip Integrated SOI-CMOS-MEMS Fabrication Technology", downloaded on Mar. 30, 2011 and available at http://www.ece.cmu.edu/~gilgunn/files/gilgunn_HH_2008.pdf.

Chen et al., Achieving Area-Selective Atomic Layer Deposition on Patterned Substrates by Selective Service Modification:, Applied Physics Letters 86, 191910 (2005).

Knez et al., "Synthesis and Surface Engineering of Complex Nanostructures by Atomic Layer Deposition", Advanced Materials, Adv. Mater. 2007, 19, 3425-3438.

Chen et al., "Investigation of Self-Assembled Monolayer Resists for Hafnium Dixoide Atomic Layer Deposition", Chem. Mater. 2005, 17, 536-544.

\* cited by examiner

US 8,440,523 B1

MICROMECHANICAL DEVICE AND METHODS TO FABRICATE SAME USING HARD MASK RESISTANT TO STRUCTURE RELEASE ETCH

TECHNICAL FIELD

The exemplary embodiments of this invention relate generally to miniaturized electrical-mechanical devices, such as switches, and more specifically to micro-electrical-mechanical systems (MEMS) and to nano-electrical-mechanical systems (NEMS) and devices.

BACKGROUND

MEMS relate to a technology of very small electrically driven mechanical devices. MEMS converges at the nanoscale with NEMS and nanotechnology in general. MEMS are sometimes referred to as micro-machines or as micro systems technology (MST). MEMS include components between about 1 to 100 micrometers in size and larger. NEMS devices are smaller still. At the size scales of MEMS devices, and even more so NEMS devices, the standard constructs of classical physics are not always useful. Due at least to the large surface area to volume ratio surface effects, such as electrostatics and wetting, can dominate the volume effects such as inertia or thermal mass.

MEMS and NEMS can be fabricated using semiconductor device fabrication technologies normally used to make electronic devices. These include photolithographic patterning, sputtering, evaporation, and wet and dry etching.

SUMMARY

In a first aspect thereof the exemplary embodiments of this invention provide a method to fabricate an electro-mechanical device. The method includes providing a structure comprised of a silicon layer disposed over an insulating layer that is disposed on a silicon substrate. The silicon layer is differentiated into a partially released region that will function as a portion of the electro-mechanical device. The method further includes forming a dielectric layer over the silicon layer; forming a hardmask over the dielectric layer, the hardmask being comprised of hafnium oxide; opening a window to expose the partially released region; and fully releasing the partially released region using a dry etching process to remove the insulating layer disposed beneath the partially released region while using the hardmask to protect material covered by the hardmask.

In another aspect thereof the exemplary embodiments of this invention provide a structure that comprises a silicon layer disposed on a buried oxide layer that is disposed on a substrate; at least one transistor device formed on or in the silicon layer, the at least one transistor comprising metallization; a released region of the silicon layer disposed over a cavity in the buried oxide layer; a back end of line (BEOL) dielectric film stack overlying the silicon layer and the at least one transistor device; a nitride layer overlying the BEOL dielectric film stack; a layer of hafnium oxide overlying the nitride layer; and an opening made through the layer of hafnium oxide, the layer of nitride and the BEOL dielectric film stack to expose the released region of the silicon layer disposed over the cavity in the buried oxide layer.

In yet another aspect thereof the exemplary embodiments of this invention provide a method to fabricate a device. The method comprises providing a structure comprised of a silicon layer disposed over an insulating layer that is disposed on a silicon substrate, the silicon layer comprising at least one partially released region intended to function as a portion of an electro-mechanical device. The method further includes forming a dielectric layer over the silicon layer; depositing a layer comprised of hafnium oxide over the dielectric layer; opening a window to expose the partially released region; and fully releasing the partially released region using a dry etching process to remove the insulating layer disposed beneath the partially released region while using the layer comprised of hafnium oxide to protect material covered by the hardmask. In the method providing the structure further comprises providing at least one transistor device formed on or in the silicon layer, and the layer comprised of hafnium oxide is deposited to cover the transistor device and metal associated with the transistor device.

BRIEF DESCRIPTION OF THE SEVERAL VIEWS OF THE DRAWINGS

FIG. 2A a starting SOI wafer;

FIG. 2B shows the structure of FIG. 2A after deposition of transistor metal, a back end of line (BEOL) film stack and an overlying layer of nitride;

FIG. 2C shows the structure of FIG. 2B after deposition of a hardmask (HM) layer;

FIG. 2D shows the structure of FIG. 2C after deposition of a layer of photoresist 48, the patterning of the photoresist to define a NEMS window, and the selective etching of the underlying materials down to a delineated portion of a NEMS structure;

FIG. 2E shows the structure of FIG. 2D after the layer of photoresist is stripped;

FIG. 2F shows the structure of FIG. 2E after a vapor HF etch process that releases the NEMS structure; and FIG. 2G shows the structure of FIG. 2F after the HM layer is removed.

FIG. 3A is comparable to the structure shown in FIG. 2E;

FIG. 3B shows the structure of FIG. 3A after a nitride layer has been blanket deposited;

FIG. 3C shows the structure of FIG. 3B after a nitride RIE process that leaves a nitride sleeve or spacer that lines vertical sidewalls of an opened NEMS window;

FIG. 3D shows the structure of FIG. 3C after the vapor HF etch process, where the nitride spacer inhibits undercutting of the BEOL film stack; and FIG. 3E shows the structure of FIG. 3D after the HM layer is removed.

DETAILED DESCRIPTION

Figure 1:
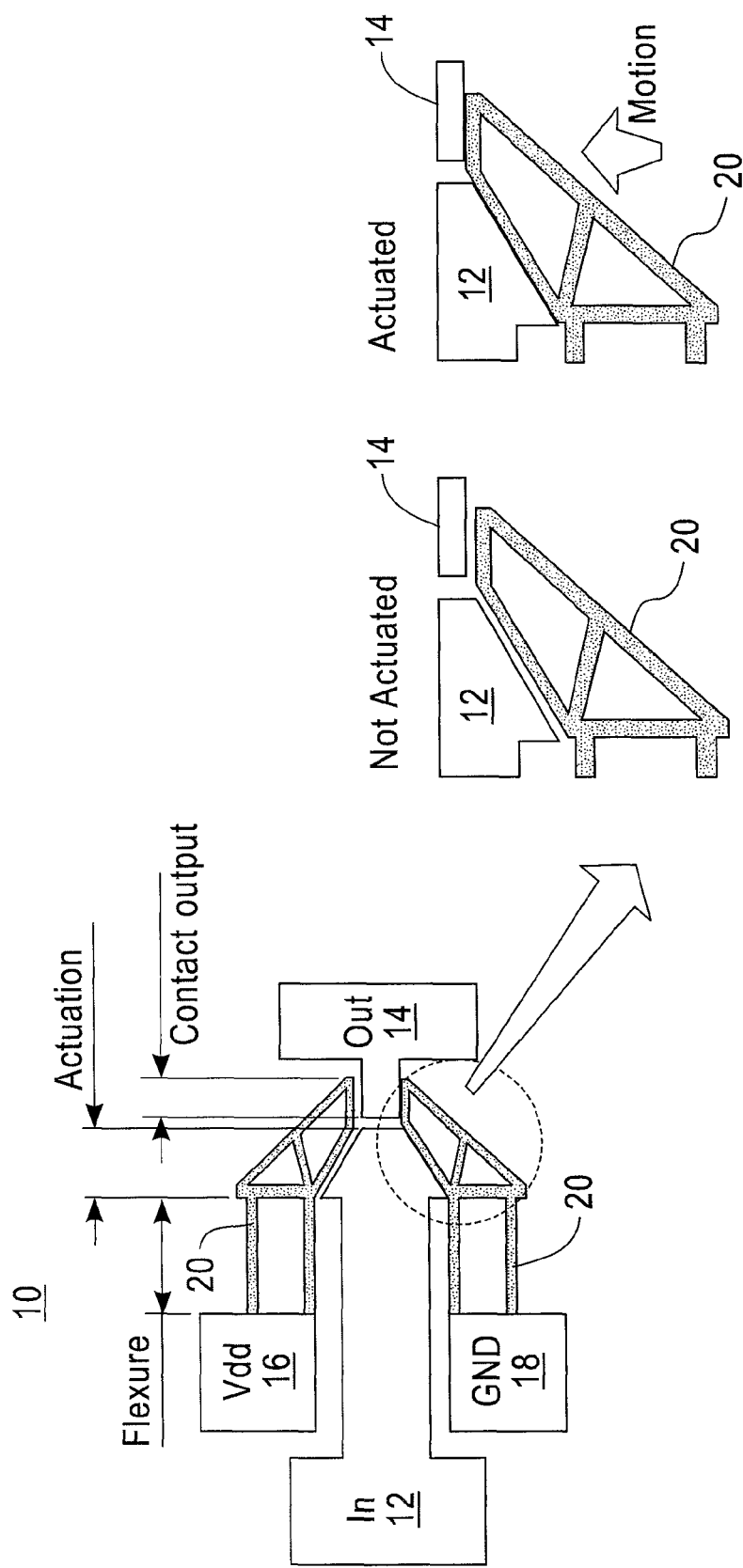
FIG. 1 is a top enlarged view of one non-limiting embodiment of a (symmetrical) NEMS switch that can be constructed using the exemplary embodiments of this invention using a starting SOI wafer.

The use of NEMS (and MEMS) as switches in memory and other applications can be beneficial. For example, as compared to transistors electro-mechanical switches can reduce standby leakage current and potentially can exhibit improved sub-threshold behavior. However the large control gate voltage (typically some tens volts) and overall reliability are two issues that need to be addressed in order to use NEMS as switches.

A silicon-on-insulator (SOI) substrate can be used for NEMS applications. The co-integration of complementary metal oxide semiconductor (CMOS) and NEMS technologies can be achieved using SOI wafers.

There is increased interest in NEMS/MEMS CMOS co-integration to deliver increased functionality and reduced power consumption and/or to provide electrical readout for NEMS/MEMS.

SOI NEMS/MEMS exhibit good mechanical properties. SOI NEMS/MEMS devices have found wide application as sensors and transducers. In addition SOI-based transistors are a mainstream manufacturing technology (e.g., partially depleted SOI or PDSOI) and show promise for next generation CMOS scaling (FinFET/Trigate and extremely thin SOI (ETSOI)). SOI NEMS/MEMS and SOI FinFET/Trigate transistors can be integrated monolithically.

An important step in NEMS/MEMS fabrication is structure release, whereby a moveable portion of the NEMS/MEMS device is physically released from the surrounding silicon material and the underlying layer of oxide (buried oxide or BOX) over which it has been photolithographically defined.

There are certain issues associated with fabricating NEMS/MEMS structures. For example, one issue relates to a conventional wet chemical etch (e.g., one based on hydrofluoric (HF) acid). In general a wet chemical etch can be disadvantageous for achieving the NEMS release and subsequent processing as it can result in an increase in NEMS stiction. Stiction may be generally defined as a force required to cause one body that is in contact with another body to begin to move.

Vapor HF is one known technique to release a MEMS/NEMS structure formed on a sacrificial layer of $SiO_2$.

It is known that concentrated HF will attack photoresist. In response a buffered oxide etch (BOE, HF and ammonium fluoride) is commonly used when photoresist is present. HF vapor is similar to concentrated HF as it can cause integration issues with photoresist.

When HF vapor is employed important requirements for a mask to be used for NEMS/MEMS release, especially when co-integrated with CMOS devices, include a requirement that the mask be resistant to the HF vapor, and that the mask can subsequently be easily removed by a reactive ion etch (RIE) or by dry processing. Ideally the mask removal process should not attack or degrade any already present Si/silicide/metals such as Cu and/or W/nitride.

The exemplary embodiments of this invention provide a process flow that uses $HfO_2$ as a hard mask for MEMS/NEMS HF vapor release.

In accordance with the exemplary embodiments of this invention a layer of $HfO_2$ is deposited over a structure containing a NEMS/MEMS that is to be released. An opening is formed in the layer of $HfO_2$ using photolithography and RIE. The layer of $HfO_2$ serves as hard mask during NEMS/MEMS release, as even a very thin layer (~2 nm) of $HfO_2$ is very resistant to HF and oxide RIE chemistries. The $HfO_2$ layer is then subsequently removed by, for example, an RIE process after the NEMS/MEMS structure is released by the use of, for example, a dry, vapor HF process to mitigate stiction and other issues.

In accordance with an exemplary embodiment the $HfO_2$ hard mask-based process flow can be integrated with a protective spacer (e.g., a spacer formed from a nitride such as $Si_3N_4$) to prevent an aggressive undercutting of back end of line (BEOL) dielectrics during the HF mediated release process.

It is pointed out that the teachings of this invention are not limited to the fabrication of NEMS devices per se, but can be applied as well to the fabrication of MEMS devices and, in general, to the fabrication of a variety of miniaturized electrical-mechanical systems and devices. In addition, the embodiments can be applied to both SOI and ETSOI starting wafers.

Note that the various layer thicknesses discussed below are merely exemplary. As such, and by example, embodiments of this invention can be practiced using an extremely thin SOI (ETSOI) wafer, where the BOX layer may have a thickness of about 50 nm or less and where the overlying layer of Si may have a thickness of about 10 nm or less.

Note as well that the layer thicknesses shown in FIGS. 2 and 3 are not drawn to scale.

FIG. 1 is a top enlarged view of one exemplary and non-limiting embodiment of a (symmetrical) NEMS switch 10 that could be constructed using the exemplary embodiments of this invention using a SOI wafer. The structure shown may be formed to have a total area of less than 5 $\mu m^2$. The switch 10 includes an input terminal 12, an output terminal 14 and control electrodes or terminals 16 and 18 (designated Vdd and GND, respectively.) The application of a suitable control input to the terminals 16 and 18 results in flexure (motion) of a moveable at least partially electrically conductive structure 20 between a not actuated state and an actuated state. When in the actuated state (the switch is turned on) an electrically conductive path is established between the input terminal 12 and the output terminal 14 via the electrically conductive portion of the structure 20 that physically contacts the input terminal 12 and the output terminal 14.

FIGS. 2A-2G show an exemplary process flow in accordance with certain embodiments of this invention. FIGS. 3A-3E show another exemplary process flow further in accordance with the embodiments of this invention. It can be noted that while a single released member is shown as being formed, in practice a large number of such released members can be simultaneously foamed.

The embodiment of FIGS. 2A-2G will be described first.

Figure 2A:
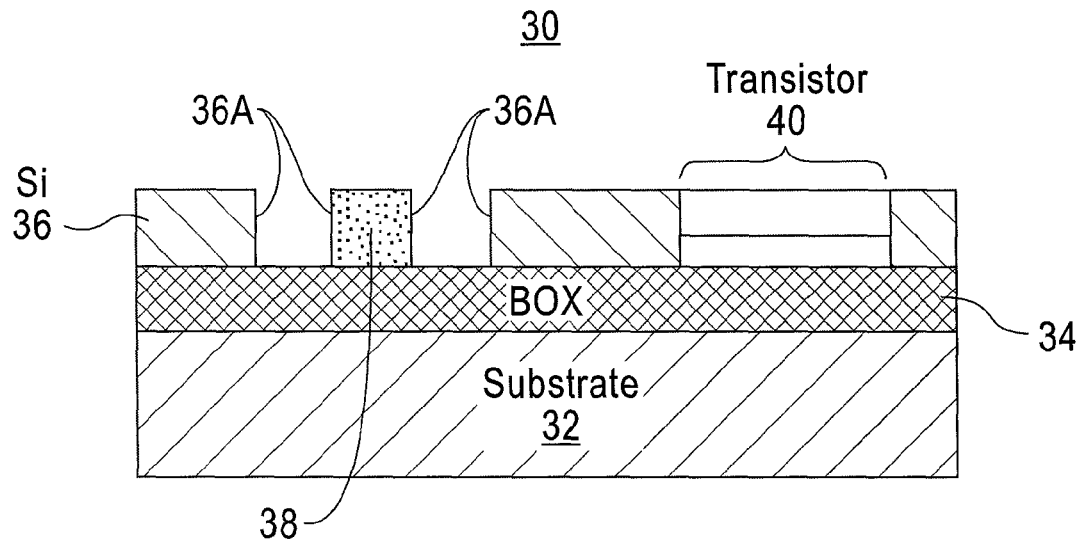
FIGS. 2A-2G, collectively referred to as FIG. 2, show an exemplary process flow in accordance with the exemplary embodiments of this invention, where.

In FIG. 2A a starting SOI wafer 30 is provided. The SOI wafer 30 includes a substrate (e.g., Si) 32, a layer of buried insulator or buried oxide (BOX) 34, such as $SiO_2$, and an overlying layer of Si 36. The substrate 32 can have any suitable thickness. The BOX 34 can have a thickness in the range of, for example, about 100 nm to about 200 nm, with about 140 nm being one suitable value. The Si layer 36 can have an initial thickness in the range of, for example, about 50 nm to about 100 nm, with about 80 nm being one suitable value. In FIG. 2A it is assumed that the Si layer 36, in which the NEMS structure will be fabricated, has been thinned to a desired thickness in a range of, for example, about 20 nm to about 50 nm, with about 30 nm being one suitable value. The Si layer 36 is masked and patterned and a reactive ion etch (RIE) process is used to selectively remove a portion of the Si layer 36 to delineate the desired NEMS structure. In FIG. 2A the delineated portion is designated 38 and can correspond to, for example, what will form a part of the moveable electrically conductive structure 20 shown in FIG. 1. This process also forms what may be referred to as openings or apertures 36a through the thinned Si layer 36. The delineated portion 38 can be considered herein as a "partially released" region of the Si layer 36, as it is still disposed on the surface of the underlying BOX 34. This partially released region of the Si layer 36 will be fully released during the performance of the dry etch process described below in reference to FIG. 2F and FIG. 3D.

FIG. 2A also shows an example of a transistor 40 (a CMOS transistor) that has been fabricated in or on the Si layer 36. The stage of processing shown in FIG. 2A may be considered to be at the completion of a front end of line (FEOL) portion of processing wherein the NEMS and CMOS transistor have been co-integrated. The transistor 40 can be any type of desired transistor, including a FinFET or a Tri-gate FET.

Figure 2B:
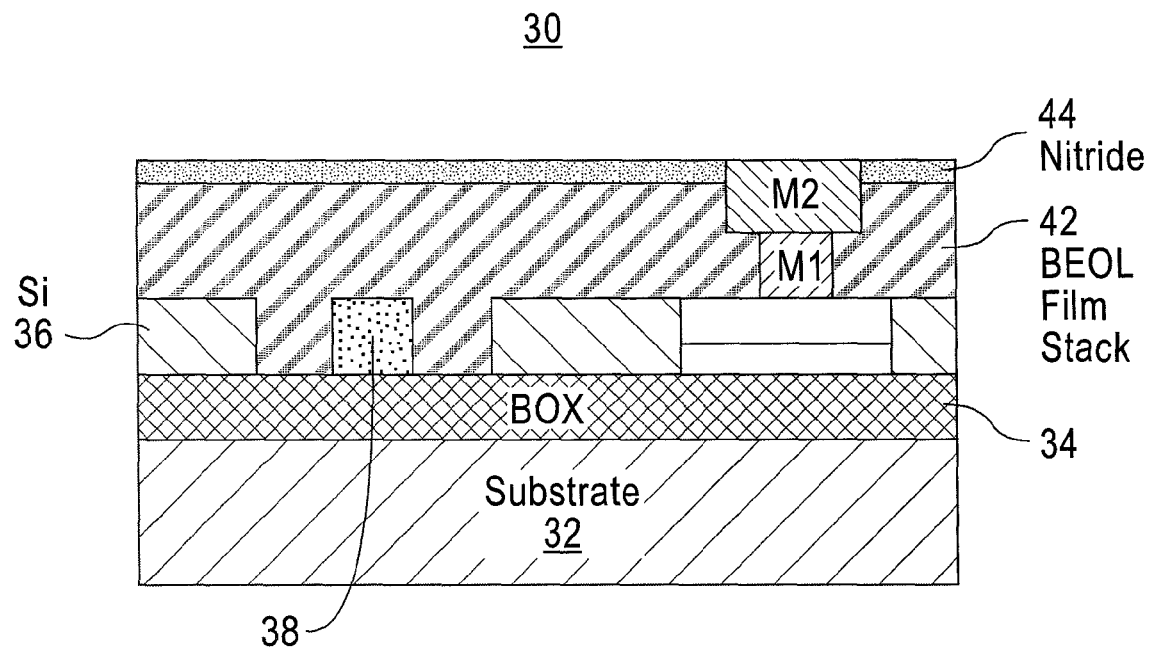

FIG. 2B shows the structure of FIG. 2A after deposition of transistor metal (e.g., metal 1 (M1) and metal 2 (M2)), a back end of line (BEOL) film stack 42 (oxide, nitride) and an overlying layer of nitride (e.g., $Si_3N_4$). The M1 can be any desired contact area (CA) metal such as tungsten and can have an exemplary thickness in the range of about 700-800 Å, while the M2 could be thicker and be composed of, for example, copper or tungsten.

Figure 2C:
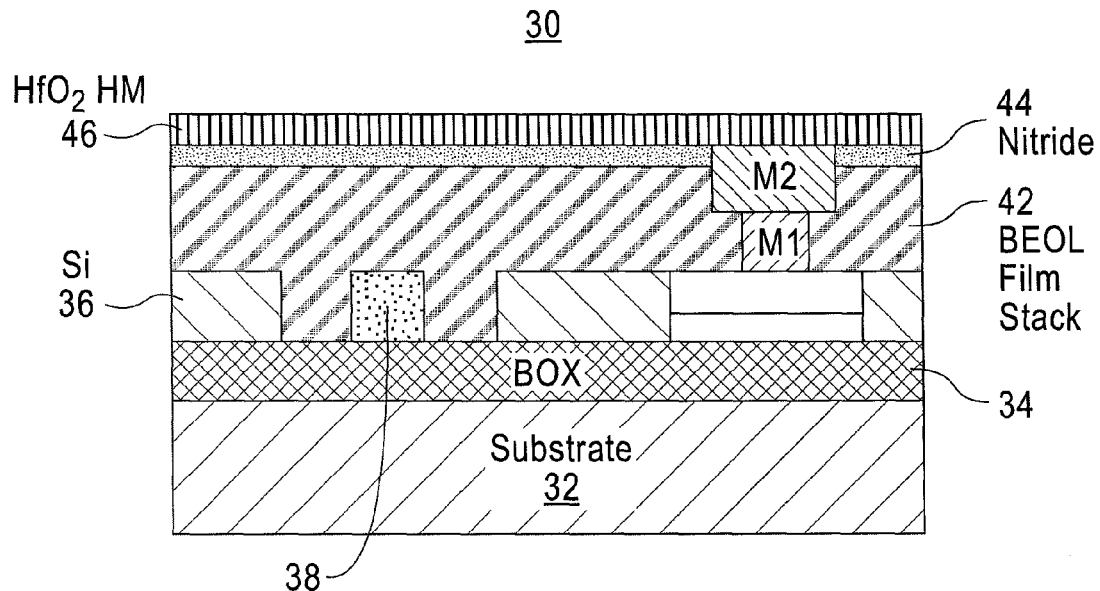

FIG. 2C shows the structure of FIG. 2B after deposition of a hardmask (HM) layer 46, preferably one composed of $HfO_2$. The $HfO_2$ HM layer 46 can have a thickness in a range of about 1-5 nm, with about 2-3 nm being more preferred. The $HfO_2$ HM layer 46 can be deposited using atomic layer deposition (ALD) and preferably exhibits a high quality, substantially defect free surface. The use of ALD to deposit $HfO_2$ is well characterized in the art. As two examples, reference can be made to Synthesis and Surface Engineering of Complex Nanostructures by Atomic Layer Deposition, M. Knez et al., Adv. Mater. 2007, 19, 3425-3438, and to Investigation of Self-Assembled Monolayer Resists for Hafnium Dioxide Atomic Layer Deposition, R. Chen et al., Chem. Mater. 2005, 17, 536-544.

Figure 2D:
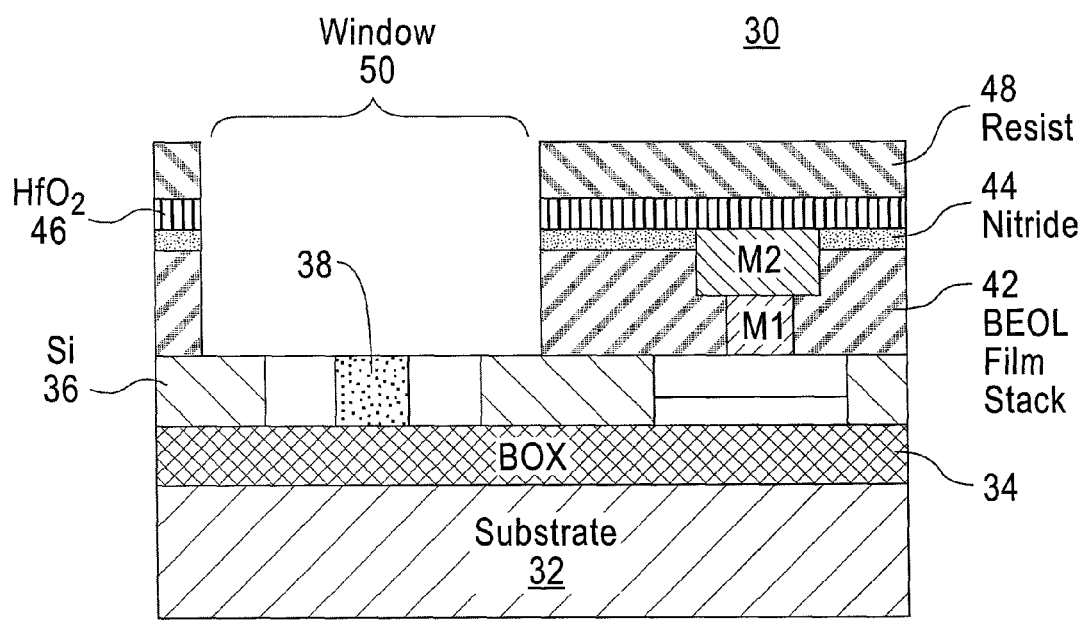

FIG. 2D shows the structure of FIG. 2C after deposition of a layer of photoresist 48, the patterning of the photoresist 48 to define a NEMS window 50, and the selective etching of the underlying $HfO_2$ HM layer 46, the nitride layer 44 and the BEOL film stack down to the delineated portion of the NEMS structure 38 to form the NEMS window 50. The selective etching is preferably a multi-step RIE process where the $HfO_2$ HM layer 46 is removed with a 250° C. chuck temperature using $BCl_3$/Ar at a 5:1 ratio. The oxide/nitride RIE can use $CF_x$ with Ar or $O_2$.

Figure 2E:
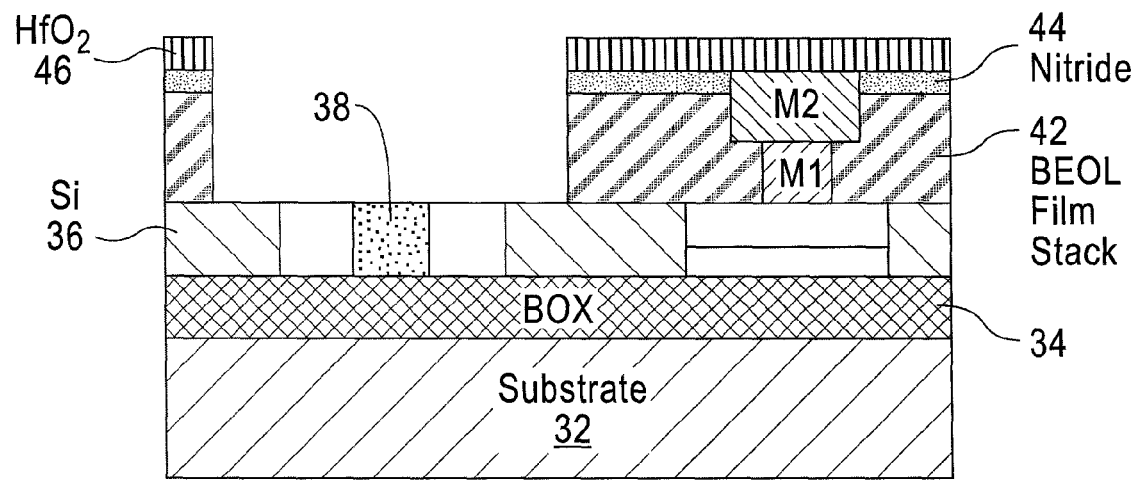

FIG. 2E shows the structure of FIG. 2D after the layer of photoresist 48 is stripped thereby exposing the upper surface of the underlying $HfO_2$ HM layer 46.

Figure 2F:
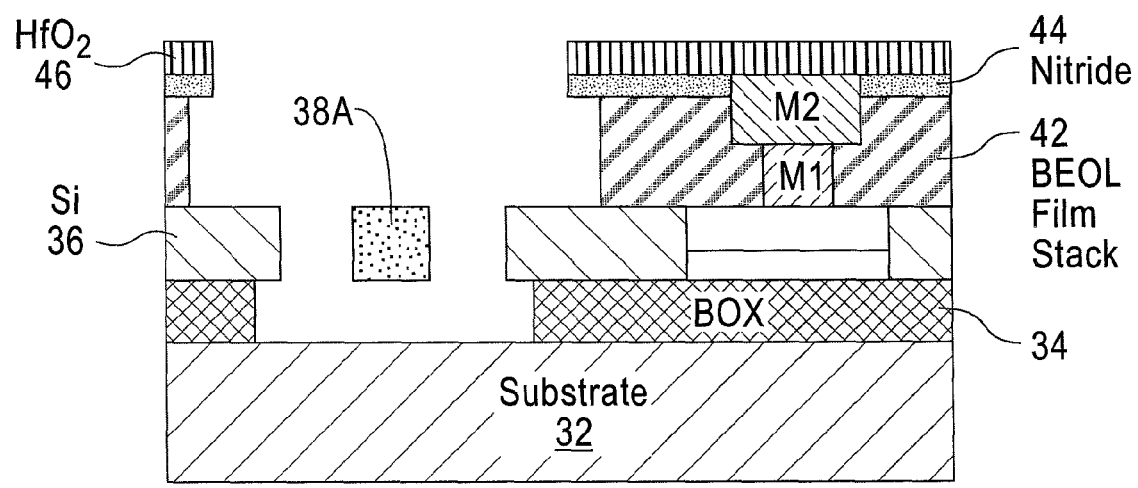

FIG. 2F shows the structure of FIG. 2E after a dry etch, more specifically a vapor HF etch process, is performed to completely remove through the NEMS window 50 remaining portion of the BEOL film stack 42 adjacent to the delineated portion 38 of the Si layer 36 and the underlying material of the BOX 34, thereby forming a cavity within the BOX material and releasing the delineated portion 38 from the BOX layer 34 to form a released structure 38A. In FIG. 2F a region of connection between the released structure 38A and the Si layer 36 is not shown. The result of the isotropic vapor HF etch process also serves to undercut to some distance the material of the BOX layer 34 beneath the Si layer 36 as well as to undercut the BEOL film stack 42 beneath the nitride layer 44. Due to the difference in growth temperatures the BEOL film stack 42 can be undercut to a greater extent than the BOX 34.

In accordance with an aspect of this invention the $HfO_2$ HM layer 46 is resistant to the vapor HF etch, thereby protecting the underlying material layers.

Figure 2G:
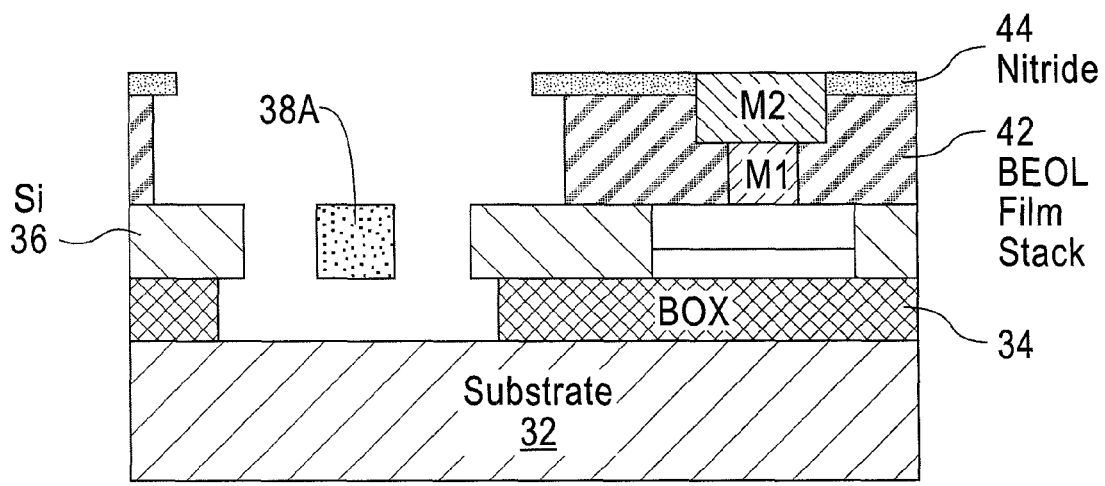

FIG. 2G shows the structure of FIG. 2F after the $HfO_2$ HM layer 46 is removed. The removal process can include a first step of damaging/degrading the surface of the $HfO_2$ HM layer 46 followed by RIE using the same chemistry as in FIG. 2D, i.e., a 250° C. chuck temperature using $BCl_3$/Ar at a 5:1 ratio. The surface of the $HfO_2$ HM layer 46 can be damaged using, for example, a high energy Ar bombardment. This enables the $HfO_2$ HM layer 46 to be quickly removed by the RIE process with minimal impact of the other structures.

At this point the structure shown in FIG. 2G can be further processed as desired, such as by siliciding at least a portion of the released structure 38A as described in commonly owned U.S. patent application Ser. No. 13/164,126, filed 20 Jun. 2011, entitled "Silicide Micromechanical Device and Methods to Fabricate Same", by Michael A. Guillorn, Eric A. Joseph, Fei Liu and Then Zhang.

A description is now made of FIGS. 3A-3E which show another exemplary process flow further in accordance with embodiments of this invention, specifically the use of a nitride spacer to prevent the undercutting of the BEOL film stack 42 during the HF etch step.

Figure 3A:
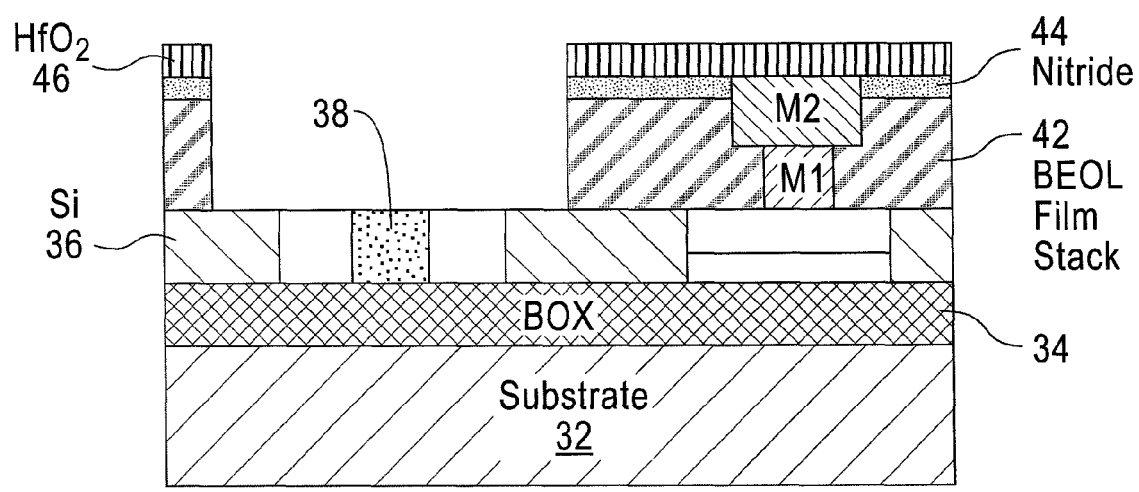
FIGS. 3A-3E, collectively referred to as FIG. 3, show a process flow variation further in accordance with the exemplary embodiments of this invention, where.

FIG. 3A is comparable to the structure shown in FIG. 2E, i.e., the structure of FIG. 2D after the NEMS window 50 has been opened and the layer of photoresist 48 has stripped thereby exposing the upper surface of the underlying $HfO_2$ HM layer 46.

Figure 3B:
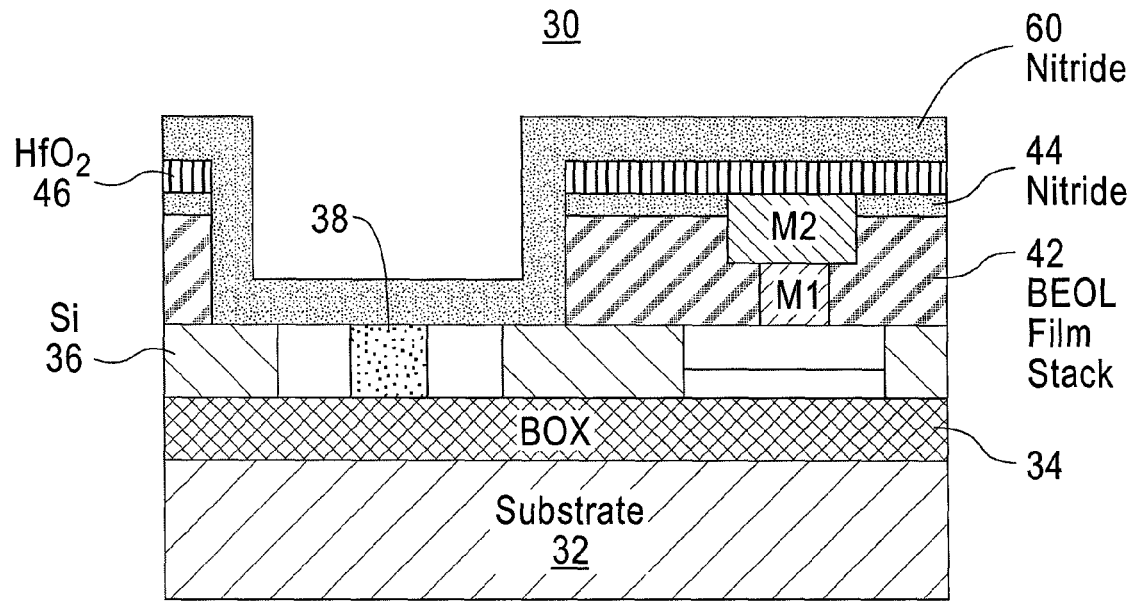

FIG. 3B shows the structure of FIG. 3A after a nitride layer 60 has been blanket deposited. The nitride layer (e.g., $Si_3N_4$) can have a thickness in a range of several nanometers to several tens of nanometers and covers the top surface of the $HfO_2$ HM layer 46 and the sidewalls and bottom surface of the opened NEMS window 50.

Figure 3C:
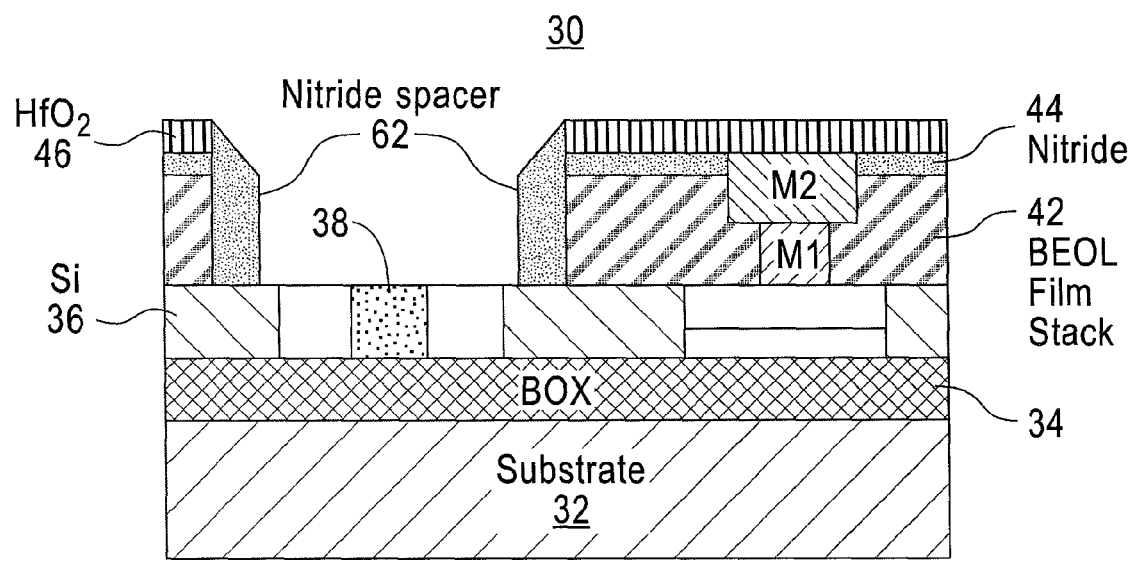

FIG. 3C shows the structure of FIG. 3B after a conventional nitride RIE process that serves to remove the nitride from horizontal surfaces, leaving a nitride sleeve or spacer 62 that lines the vertical sidewalls of the opened NEMS window 50.

Figure 3D:
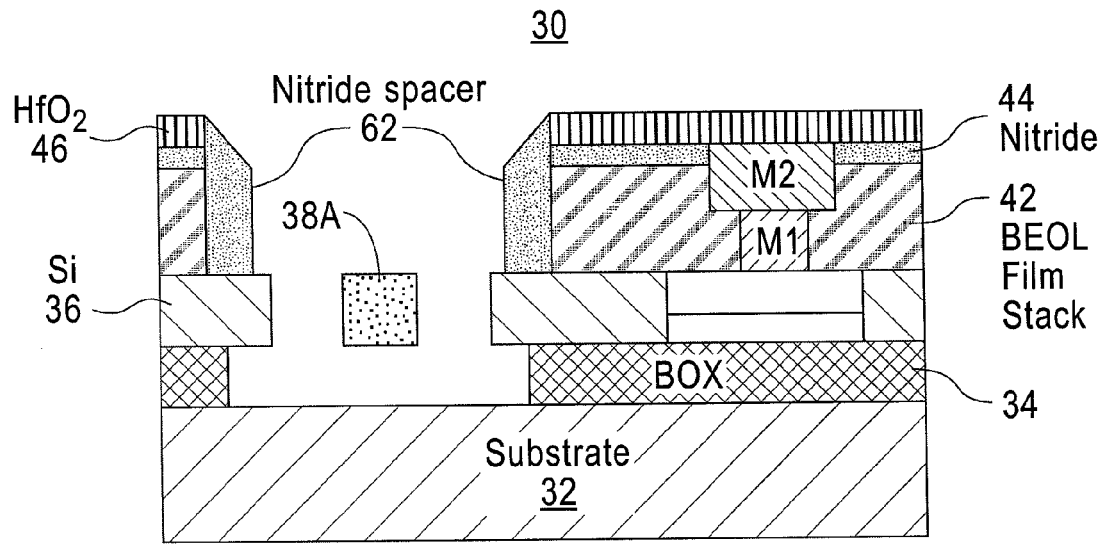

FIG. 3D shows the structure of FIG. 3C after the dry etch is performed, more specifically the vapor HF etch process. As before the vapor HF etch completely removes through the NEMS window 50 remaining portion of the BEOL film stack 42 adjacent to the delineated portion 38 of the Si layer 36 and the underlying material of the BOX 34, thereby forming the cavity within the BOX material and releasing the delineated portion 38 from the BOX layer 34 to form the released structure 38A. The result of the isotropic vapor HF etch process also serves to undercut to some distance the material of the BOX layer 34 beneath the Si layer 36. However, due to the presence of the nitride spacer 62 the undercutting of the BEOL film stack 42 is avoided.

Figure 3E:
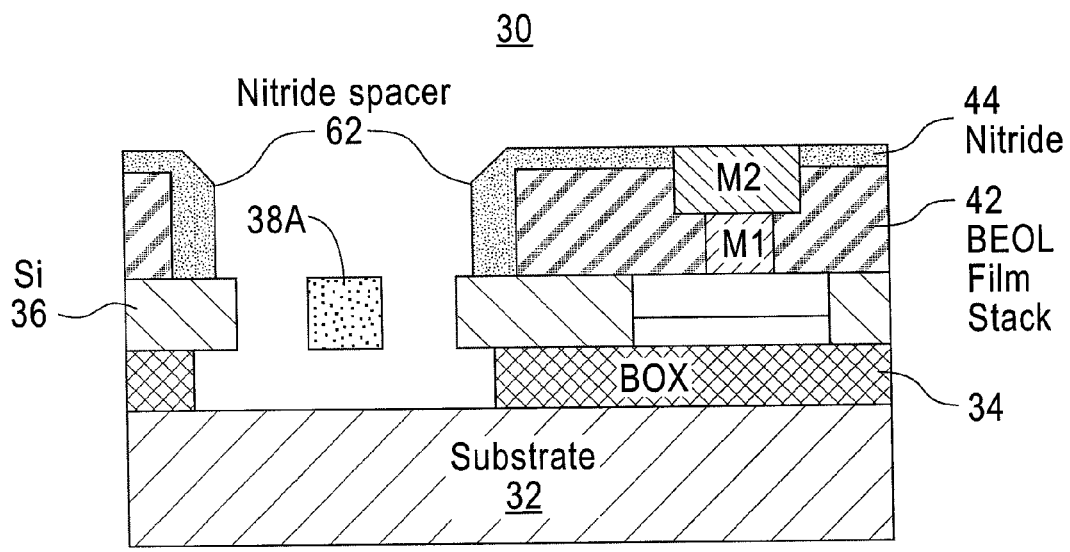

FIG. 3E shows the structure of FIG. 3D after the $HfO_2$ HM layer 46 is removed. The removal process can be performed as described above for FIG. 2G.

Many modifications and variations can become apparent to those of ordinary skill in the art without departing from the scope and spirit of the invention. For example, different materials, metals, thicknesses, processing steps and parameters can be used. Further, the exemplary embodiments are not limited to the fabrication of switches in MEMS or in NEMS devices and structures.

As will be appreciated by one skilled in the art, aspects of the present invention may be embodied as a system, method or computer program product for controlling the processing of the SOI wafer as discussed above in FIGS. 2 and 3. Thus, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. The embodiments were chosen and described in order to best explain the principles of the invention and the practical applications thereof, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent mathematical expressions may be used by those skilled in the art. However, all such and similar modifications of the teachings of this invention will still fall within the scope of this invention.

The invention claimed is:

1. A method to fabricate an electro-mechanical device, comprising:
    providing a structure comprised of a silicon layer disposed over an insulating layer that is disposed on a silicon substrate, the silicon layer being differentiated into a partially released region that will function as a portion of the electro-mechanical device;
    forming a dielectric layer over the silicon layer;
    forming a hardmask over the dielectric layer, the hardmask being comprised of hafnium oxide;
    opening a window to expose the partially released region; and
    fully releasing the partially released region using a dry etching process to remove the insulating layer disposed beneath the partially released region while using the hardmask to protect material covered by the hardmask.

2. The method of claim 1, where fully releasing is performed using a HF vapor.

3. The method of claim 1, where providing the structure further comprises providing at least one transistor device formed on or in the silicon layer, and where the hardmask covers the transistor device and metal associated with the transistor device.

4. The method of claim 1, where opening the window to expose the partially released region includes forming a nitride spacer on vertical sidewalls of the opened window to inhibit undercutting of the dielectric layer during the step of fully releasing.

5. The method of claim 1, where forming the hardmask forms the hardmask to have a thickness in a range of about 1 nm to about 5 nm.

6. The method of claim 1, where forming the hardmask is performed using atomic layer deposition, and where the hardmask exhibits a substantially defect free surface.

7. The method of claim 1, where the hardmask is formed to exhibit a substantially defect free surface and further comprising removing the hardmask subsequent to the step of fully releasing, where removing the hardmask comprises performing a step of degrading the surface of the hardmask and a step of reactive ion etching the hardmask to remove it.

8. The method of claim 1, where forming the dielectric layer over the silicon layer further comprises forming a nitride layer over the dielectric layer, and where forming the hardmask forms the hardmask on the nitride layer.

9. The method of claim 1, where the fully released portion of the silicon layer forms a part of a moveable, current conducting portion of a MEMS or NEMS switch.

10. A method to fabricate a device, comprising:
    providing a structure comprised of a silicon layer disposed over an insulating layer that is disposed on a silicon substrate, the silicon layer comprising at least one partially released region intended to function as a portion of an electro-mechanical device;
    forming a dielectric layer over the silicon layer;
    depositing a layer comprised of hafnium oxide over the dielectric layer;
    opening a window to expose the partially released region; and
    fully releasing the partially released region using a dry etching process to remove the insulating layer disposed beneath the partially released region while using the layer comprised of hafnium oxide to protect material covered by the hardmask, where
    providing the structure further comprises providing at least one transistor device formed on or in the silicon layer, and where the layer comprised of hafnium oxide covers the transistor device and metal associated with the transistor device.

11. The method of claim 10, where fully releasing is performed using a HF vapor.

12. The method of claim 10, where opening the window to expose the partially released region includes forming a nitride spacer on vertical sidewalls of the opened window to inhibit undercutting of the dielectric layer during the step of fully releasing.

13. The method of claim 10, where the layer comprised of hafnium oxide has a thickness in a range of about 1 nm to about 5 nm and is deposited using atomic layer deposition.

14. The method of claim 10, further comprising removing the layer comprised of hafnium oxide subsequent to the step of fully releasing, where removing the layer comprised of hafnium oxide comprises performing a step of degrading a surface of the layer comprised of hafnium oxide and a step of reactive ion etching the layer comprised of hafnium oxide to remove it.

15. The method of claim 10, where forming the dielectric layer over the silicon layer comprises forming a nitride layer and where the layer comprised of hafnium oxide is deposited on the nitride layer.

16. The method of claim 10, where the fully released portion of the silicon layer forms a part of a moveable, current conducting portion of a MEMS or NEMS switch.

* * * * *